United States Patent
Nakamura (10) Patent No.: US 9,737,972 B2
(45) Date of Patent: Aug. 22, 2017

(54) POLISHING PAD

(71) Applicant: TOYO TIRE & RUBBER CO., LTD., Osaka-shi, Osaka (JP)

(72) Inventor: Kenji Nakamura, Osaka (JP)

(73) Assignee: ROHM AND HAAS ELECTRONIC MATERIALS CMP HOLDINGS, INC., Newark, DE (US)

( * ) Notice: Subject to any disclaimer, the term of this patent is extended or adjusted under 35 U.S.C. 154(b) by 234 days.

(21) Appl. No.: 14/650,294

(22) PCT Filed: Oct. 31, 2013

(86) PCT No.: PCT/JP2013/079558
§ 371 (c)(1),
(2) Date: Jun. 5, 2015

(87) PCT Pub. No.: WO2014/087771
PCT Pub. Date: Jun. 12, 2014

(65) Prior Publication Data
US 2015/0298286 A1  Oct. 22, 2015

(30) Foreign Application Priority Data
Dec. 6, 2012 (JP) .................................. 2012-267361

(51) Int. Cl.
*B24B 37/00* (2012.01)
*B24B 37/22* (2012.01)
(Continued)

(52) U.S. Cl.
CPC ............ *B24B 37/22* (2013.01); *B24B 37/013* (2013.01); *B24B 37/205* (2013.01); *H01L 21/304* (2013.01)

(58) Field of Classification Search
CPC ..... B24B 37/22; B24B 37/013; B24B 37/205; H01L 21/304
(Continued)

(56) References Cited

U.S. PATENT DOCUMENTS

| 6,454,630 | B1 * | 9/2002 | Tolles | .................. B24B 37/013 451/287 |
| 6,994,607 | B2 * | 2/2006 | Wiswesser | ............ B24B 37/205 451/285 |

(Continued)

FOREIGN PATENT DOCUMENTS

| JP | 2001162520 A | 6/2001 |
| JP | 2003285258 A | 7/2003 |

(Continued)

OTHER PUBLICATIONS

A Notice to Submit a Response issued by Korean Intellectual Property Office, dated Jan. 12, 2016, for Korean counterpart application No. 10-2015-7009552.

(Continued)

*Primary Examiner* — George Nguyen
(74) *Attorney, Agent, or Firm* — Law Office of Katsuhiro Arai (57) ABSTRACT

The purpose of the present invention is to provide a polishing pad that hardly generates scratches on a surface of a subject to be polished. This polishing pad is characterized in that: the polishing pad is provided with a polishing layer having a polishing region and a light-transmitting region; the light-transmitting region includes a surface layer positioned on the pad surface side, and at least one soft layer laminated under the surface layer, and the soft layer has a hardness lower than that of the surface layer.

12 Claims, 1 Drawing Sheet

(51) Int. Cl.
*B24B 37/013* (2012.01)
*B24B 37/20* (2012.01)
*H01L 21/304* (2006.01)

(58) Field of Classification Search
USPC .................................. 451/6, 41, 285–290
See application file for complete search history.

(56) References Cited

U.S. PATENT DOCUMENTS

| | | | | |
|---|---|---|---|---|
| 7,179,151 | B1* | 2/2007 | Bottema | B24B 37/013 451/285 |
| 7,553,214 | B2* | 6/2009 | Menk | B24B 21/04 451/533 |
| 7,874,894 | B2* | 1/2011 | Fukuda | B24B 37/205 451/41 |
| 2002/0042243 | A1 | 4/2002 | Ihsikawa et al. | |
| 2004/0055223 | A1 | 3/2004 | Ono et al. | |
| 2004/0259484 | A1* | 12/2004 | Prasad | B24D 3/32 451/287 |
| 2005/0197050 | A1* | 9/2005 | Prasad | B24B 37/205 451/41 |
| 2006/0128271 | A1* | 6/2006 | Shiho | B24B 37/205 451/6 |
| 2008/0003923 | A1* | 1/2008 | Benvegnu | B24B 49/12 451/6 |
| 2009/0017726 | A1* | 1/2009 | Swedek | B24B 37/013 451/5 |
| 2009/0093202 | A1* | 4/2009 | Fukuda | B24B 37/22 451/533 |

FOREIGN PATENT DOCUMENTS

| | | |
|---|---|---|
| JP | 2003285259 A | 7/2003 |
| JP | 2005322788 A | 11/2005 |
| JP | 200744814 A | 2/2007 |
| KR | 100905266 B1 | 6/2009 |

OTHER PUBLICATIONS

Notification of Transmittal of Translation of the International Preliminary Report on Patentability (PCT/IB/338) dated Jun. 18, 2015, with International Preliminary Report on Patentability (PCT/IB/373) and Written Opinion of the International Searching Authority (PCT/ISA/237), for corresponding international application PCT/JP2013/079558.

An Office Action Issued by the Taiwan Intellectual Property Office, dated Jan. 22, 2015, with a Search Report dated (Jan. 19, 2015) for counterpart Taiwan application No. 102140890.

International Search Report (ISR) dated Nov. 26, 2013, issued for International application No. PCT/JP2013/079558.

* cited by examiner

POLISHING PAD

This application is the U.S. National Phase under 35 U.S.C. §371 of International Application PCT/JP2013/079558, filed Oct. 31, 2013 which claims priority to Japanese Patent Application No. 2012-267361, filed Dec. 6, 2012. The International Application was published under PCT Article 21(2) in a language other than English.

TECHNICAL FIELD

The present invention relates to a polishing pad used in planarizing an uneven surface of a wafer by chemical mechanical polishing (CMP) and in particular to a polishing pad having a window (light-transmitting region) for detection of a polished state or the like by optical means, as well as a method for producing a semiconductor device by using the polishing pad.

BACKGROUND ART

Production of a semiconductor device involves a step of forming an electroconductive film on a surface of a wafer to form a wiring layer by photolithography, etching or the like; a step of forming an interlaminar insulating film on the wiring layer; and the like; and an uneven surface made of an electroconductive material such as metal and an insulating material is formed on the surface of a wafer by these steps. In recent years, processing for fine wiring and multilayer wiring have been advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique in which while the surface of a wafer to be polished is pressed against a polishing surface of a polishing pad, the surface of the wafer is polished with an abrasive in the form of slurry having abrasive grains dispersed therein (hereinafter, referred to as slurry).

Figure 1:
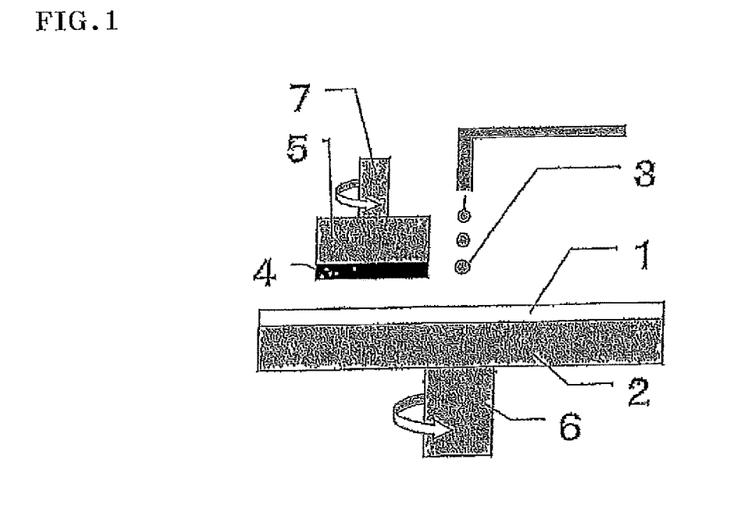
FIG. 1 is a schematic view showing one example of a polishing apparatus used in CMP polishing.

As shown in FIG. 1, a polishing apparatus used generally in CMP is provided, for example, with a polishing plate 2 for supporting a polishing pad 1; a supporting stand (polishing head) 5 for supporting a subject to be polished (wafer) 4; a backing material for uniformly pressurizing a wafer; and a mechanism of feeding an abrasive. The polishing pad 1 is fitted with the polishing plate 2, for example, by sticking with a double-sided tape. The polishing plate 2 and the supporting stand 5 are provided with rotating shafts 6 and 7, respectively, and are arranged such that the polishing pad 1 and the subject to be polished 4, both of which are supported by them, are opposed to each other. The supporting stand 5 is provided with a pressurizing mechanism for pressing the subject to be polished 4 against the polishing pad 1.

When such CMP is conducted, there is a problem of judging the planarity of wafer surface. That is, the point in time when desired surface properties or planar state are reached is required to be detected. With respect to the thickness of an oxide film, polishing speed and the like, the following has been conventionally conducted that a test wafer is periodically treated, the results are confirmed, and thereafter a wafer to be a product is subjected to a polishing treatment.

In this method, however, the treatment time of a test wafer and the cost for the treatment are wasteful, and the test wafer not subjected to processing at all in advance and a product wafer are different in polishing results due to a loading effect unique to CMP, and accurate prediction of processing results is difficult without actual processing of the product wafer.

Accordingly, there has been a need in recent years for a method capable of in situ detection of the point in time when desired surface properties and thickness are attained at the time of CMP processing, in order to solve the problem described above. In such detection, various methods are used. From the viewpoints of measurement accuracy and spatial resolution in non-contract measurement, optical detection means comes to be used mainly.

The optical detection means is specifically a method of detecting the end-point of polishing by irradiating a wafer via a polishing pad through a window (light-transmitting region) with light beam, and monitoring interference signal generated by reflection of the light beam.

Patent Document 1 discloses a polishing body having a window, for example, a window consisting of two or more plates of transparent materials that are laminated, wherein the compressive elastic modulus of the transparent material that is positioned on the side of a subject to be polished is smaller than the compressive elastic modulus of the transparent material that is positioned on the opposite side from the subject to be polished.

In addition, Patent Document 2 discloses a polishing pad provided with a polishing layer and a translucent window member, wherein the outermost layer of the polishing surface side of at least the translucent window member is composed of a soft translucent layer having a micro rubber A hardness of 60 degrees or less.

Further, Patent Document 3 discloses a polishing pad provided with a polishing layer and a translucent window member, wherein the translucent window member is at least laminated by a soft translucent layer having a micro rubber A hardness of 60 degrees or less and a hard translucent layer having a micro rubber A hardness of 80 degrees or more, and the soft translucent layer is positioned in the outermost layer of the polishing surface side.

Moreover, Patent Document 4 discloses a polishing pad having a polishing region and a light-transmitting region, wherein the light-transmitting region is formed by laminating an ultra-soft layer positioned in a pad surface side and a soft layer positioned in a pad rear face side, and the Asker A hardness of the ultra-soft layer is 25 to 55 degrees, the Asker A hardness of the soft layer is 30 to 75 degrees, and the Asker A hardness of the soft layer is larger than that of the ultra-soft layer.

Since the polishing pads disclosed in Patent Documents 1 to 4 employ a soft material in the outermost layer of the window, the occurrence of scratches can be suppressed to some extent, but cannot be sufficiently suppressed.

PRIOR ART DOCUMENTS

Patent Documents

Patent Document 1: JP-A-2001-162520
Patent Document 2: JP-A-2003-285258
Patent Document 3: JP-A-2003-285259
Patent Document 4: JP-A-2005-322788

SUMMARY OF THE INVENTION

Problems to be Solved by the Invention

The purpose of the present invention is to provide a polishing pad that hardly generates scratches on a surface of a subject to be polished.

Means for Solving the Problems

As a result of investigations to solve the above problems, the inventors have made the invention based on the finding that the object can be achieved using the polishing pad described below.

That is, the present invention relates to a polishing pad provided with a polishing layer having a polishing region and a light-transmitting region, wherein the light-transmitting region includes a surface layer positioned on the pad surface side and at least one soft layer laminated under the surface layer, and the soft layer has a hardness lower than that of the surface layer.

As described in the present invention, when a polished surface of the subject to be polished comes into contact with the surface layer of the light-transmitting region during polishing operation, cushioning properties can be imparted to the light-transmitting region by laminating the soft layer under the surface layer, wherein the hardness of the soft layer is lower than that of the surface layer. Scratches are thereby less likely to occur on the polished surface of the subject to be polished. If the surface layer of the light-transmitting region is made too soft as in a conventional case, abrasive grains in the slurry become easy to stick in the surface of the surface layer, resulting in causing the occurrence of scratches by such stuck abrasive grains easily on the surface of the subject to be polished. The present invention has solved the problem of the occurrence of scratches by imparting cushioning properties to the light-transmitting region without making the surface layer of the conventional light-transmitting region soften.

The Asker A hardness of the surface layer is preferably 35 to 80 degrees and the Asker A hardness of the soft layer is preferably 30 to 60 degrees. If the Asker A hardness of the surface layer is less than 35 degrees, abrasive grains in the slurry become easy to stick in the surface of the surface layer because the surface layer is too soft, and scratches caused by such stuck abrasive grains tend to easily occur on the polished surface of the subject to be polished. On the other hand, if the Asker A hardness of the surface layer exceeds 80 degrees, scratches easily occur on the surface of the subject to be polished and the surface of the surface layer tends to be easily damaged, thereby tending to decrease the transparency and deteriorate the accuracy in the optical end point detection of the polishing. Also, when the Asker A hardness of the soft layer is less than 30 degrees, rigidity of the entire light-transmitting region tends to become insufficient. On the other hand, when the Asker A hardness of the soft layer is more than 60 degrees, the cushioning property of the light-transmitting region is reduced and thus scratches tend to easily occur on the polished surface of the subject to be polished.

The difference in the Asker A hardness between the surface layer and the soft layer is preferably 5 degrees or more. If the difference in the Asker A hardness is less than 5 degrees, the shape stability of the light-transmitting region is reduced during polishing work and there is a risk that malfunction such as peeling or water leakage occurs.

The soft layer is preferably formed of one layer and the light-transmitting region is preferably formed of a two-layer structure of the surface layer and the soft layer.

The present invention also relates to a method for producing a semiconductor device, the method including the step of polishing a surface of a semiconductor wafer using the polishing pad.

Effect of the Invention

Since the polishing pad of the present invention has the light-transmitting region having the structure described above, scratches hardly occur on the surface of a subject to be polished.

MODE FOR CARRYING OUT THE INVENTION

The polishing pad of the present invention may be made of a polishing layer alone, or may be a laminate containing a polishing layer and the other layer (e.g. cushion layer, adhesive layer, and support film, etc.).

Figure 2:
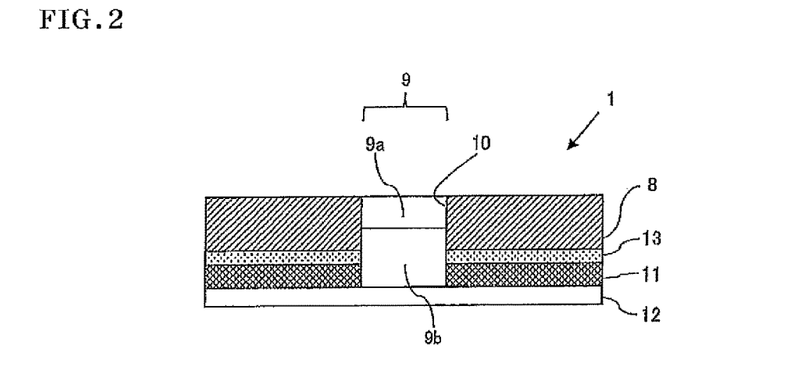
FIG. 2 is a schematic sectional view showing one example of a structure of the polishing pad of the present invention.

FIG. 2 is a schematic sectional view showing an example of the structure of the polishing pad of the present invention. As shown in FIG. 2, a polishing pad 1 is formed by laminating a polishing region 8, a cushion layer 11, and a transparent support film 12 in this order, and a light-transmitting region 9 (surface layer 9a and soft layer 9b) is provided on the transparent support film 12 in an opening part 10 that passes through the polishing region 8 and the cushion layer 11.

Figure 3:
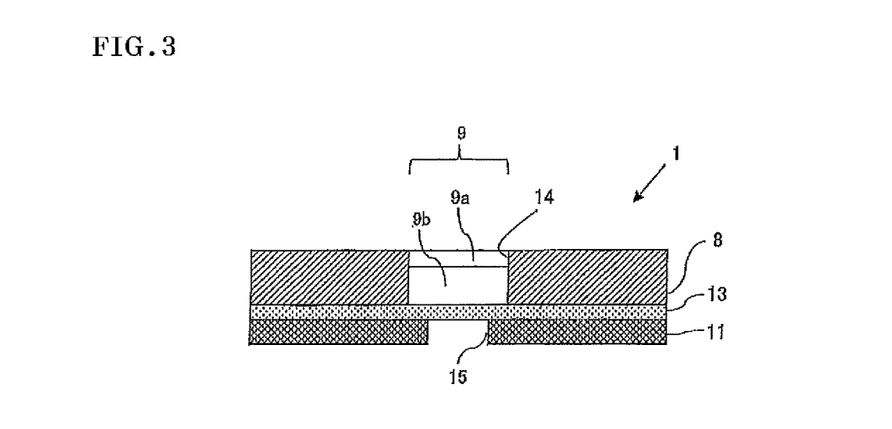
FIG. 3 is a schematic sectional view showing another example of a structure of the polishing pad of the present invention.

FIG. 3 is a schematic sectional view showing another example of the structure of the polishing pad of the present invention. As shown in FIG. 3, a polishing pad 1 is formed by laminating a polishing layer having a polishing region 8 and a light-transmitting region 9 (surface layer 9a and soft layer 9b) and a cushion layer 11 having a through hole 15 so that the light-transmitting region 9 and the through hole 15 are overlapped with a double-sided adhesive sheet 13 interposed therebetween.

The light-transmitting region 9 includes the surface layer 9a positioned on the pad surface side and at least one layer of the soft layer 9b laminated under the surface layer 9a, wherein the hardness of the soft layer 9b is lower than that of the surface layer 9a. The soft layer 9b may be a laminate that is formed by two or more layers each having a different hardness, but is usually made of a single layer.

The Asker A hardness of the surface layer is preferably 35 to 80 degrees, more preferably 50 to 75 degrees. The Asker A hardness of the soft layer is preferably 30 to 60 degrees, more preferably 30 to 50 degrees.

Also, the difference in the Asker A hardness between the surface layer and the soft layer is preferably 5 degrees or more, more preferably 10 degrees or more, furthermore preferably 20 degrees or more.

Although the material for forming the surface layer and the soft layer is not particularly limited, such a material includes, for example, polyurethane resins, polyester resins, polyamide resins, acrylic resins, polycarbonate resins, halogen-based resins (polyvinyl chloride, polytetrafluoroethylene, polyvinylidene fluoride, etc.), polystyrenes, olefin-based resins (polyethylene, polypropylene, etc.), and epoxy resins. These resins may be used alone or in combination of two or more thereof. Of these, the polyurethane resin is a preferred material because it has a high abrasion resistance and can suppress the light scattering in the light-transmitting region due to dressing marks during polishing.

The polyurethane resin comprises an organic isocyanate, a polyol (high-molecular-weight polyol and low-molecular-weight polyol) and a chain extender.

The organic isocyanate includes 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, m-xylylene diisocyanate, hexamethylene diisocyanate 1,4-cyclohexan diisocyanate, 4,4'-dicyclohexylmethane diisocyanate, isophorone diisocyanate etc. These may be used alone or as a mixture of two or more thereof.

The usable organic isocyanate includes not only the isocyanate compounds described above but also multifunctional (trifunctional or more) polyisocyanate compounds. As the multifunctional isocyanate compounds, Desmodule-N (manufactured by Bayer Ltd.) and a series of diisocyanate adduct compounds under the trade name of Duranate (Asahi Kasei Corporation) are commercially available. Because the trifunctional or more polyisocyanate compound, when used singly in synthesizing a prepolymer, is easily gelled, the polyisocyanate compound is used preferably by adding it to the diisocyanate compound.

The high-molecular-weight polyol includes polyether polyols represented by polytetramethylene ether glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, and polycarbonate polyols obtained by ester exchange reaction of a polyhydroxyl compound with aryl carbonate. These may be used singly or as a mixture of two or more thereof.

The polyol includes not only the above high-molecular-weight polyols but also low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol, 1,4-bis(2-hydroxyethoxy)benzene etc.

The chain extender includes low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol, 1,4-bis(2-hydroethoxy)benzene etc., and polyamines such as 2,4-toluene diamine, 2,6-toluene diamine, 3,5-diethyl-2,4-toluene diamine, 4,4'-di-sec-butyl-diaminodiphenyl methane, 4,4'-diaminodiphenyl methane, 3,3'-dichloro-4,4'-diaminodiphenyl methane, 2,2',3,3'-tetrachloro-4,4'-diaminodiphenyl methane, 4,4'-diamino-3,3'-diethyl-5,5'-dimethyl diphenyl methane, 3,3'-diethyl-4,4'-diaminodiphenyl methane, 4,4'-methylene-bis-methyl anthranylate, 4,4'-methylene-bis-anthranylic acid, 4,4'-diaminodiphenyl sulfone, N,N'-di-sec-butyl-p-phenylene diamine, 4,4'-methylene-bis(3-chloro-2,6-diethylamine), 3,3'-dichloro-4,4'-diamino-5,5'-diethyl diphenyl methane, 1,2-bis(2-aminophenylthio) ethane, trimethylene glycol-di-p-aminobenzoate, 3,5-bis(methylthio)-2,4-toluene diamine etc. These may be used singly or as a mixture of two or more thereof.

The proportion of the organic isocyanate, the polyol and the chain extender in the polyurethane resin can be changed suitably depending on their respective molecular weights, desired physical properties of the surface layer and the soft layer produced therefrom, etc. In order to adjust an Asker hardness A of each of the surface layer and the soft layer to within the range described above, the ratio of the number of isocyanate groups of the organic isocyanate to the number of functional groups in total (hydroxyl group+amino group) in the polyol and the chain extender is preferably 0.9 to 1.2, more preferably 0.95 to 1.05.

In order to adjust an Asker hardness A of each of the surface layer and the soft layer to within the range described above, it is preferable to add a plasticizer to the polyurethane resin. Any known plasticizers can be employed without a specific limitation. Examples thereof include: phthalic acid diesters such as dimethyl phthalate, diethyl phthalate, dibutyl phthalate, di(2-ethylhexyl) phthalate, dinonyl phthalate and dilauryl phthalate; aliphatic dibasic acid esters such as dioctyl adipate, di(2-ethylhexyl) adipate, diisononyl adipate, dibutyl sebacate, dioctyl sebacate, and di(2-ethylhexyl) sebacate; phosphoric acid triesters such as tricresyl phosphate, tri(2-ethylhexyl)phosphate, and tri(2-chloropropyl) phosphate; glycol esters such as polyethylene glycol ester and diethylene glycol monobutyl ether acetate; and epoxy compounds such as epoxidized soybean oil and epoxy aliphatic acid ester. Among them, preferably used is a glycol ester-based plasticizer from the viewpoint of compatibility with a polyurethane resin or a slurry.

The polyurethane resin can be produced by applying a known urethane forming technique such as a melting method, a solution method, and the like, among which the melting method is preferable in consideration of cost, working environment, and the like.

A polymerization procedure for a polyurethane resin can be either a prepolymer method or a one shot method, and preferable is the prepolymer method in which an isocyanate-terminated prepolymer is synthesized from an organic isocyanate and a polyol in advance and then reacted with a chain extender so that high transparency is ensured. In the case of the prepolymer method, it is preferable to add a plasticizer to the isocyanate-terminated prepolymer in order to make a uniform dispersion.

The production of the light-transmitting region containing the surface layer and the soft layer is not particularly limited, and such a light-transmitting region can be prepared by known methods including, for example, 1) a method of forming each layer and bonding it together with an adhesive, or 2) a method of forming the soft layer and then forming the surface layer on the soft layer by a cast molding method.

The shape and size of the light-transmitting region are not particularly limited, but are preferably similar to the shape and size of the opening part of the polishing region.

The thickness of the soft layer is preferably 0.5 to 2 times the thickness of the surface layer, more preferably 1 to 1.5 times the thickness of the surface layer. If the thickness of the soft layer is less than 0.5 times the thickness of the surface layer, sufficient cushioning property cannot be imparted to the light-transmitting region, and in the case where the thickness of the soft layer is more than 2 times the thickness of the surface layer, shape stability of the light-transmitting region tends to be decreased.

The material used for forming the polishing region can be any material that can be usually used without limitation as the material of the polishing layer, but it is preferable to use a fine foam body therefor. For example, polyurethane resin, polyester resin, polyamide resin, acrylic resin, polycarbonate resin, halogenated resin (polyvinyl chloride, polytetrafluoroethylene, polyvinylidene fluoride etc.), polystyrene, olefinic resin (polyethylene, polypropylene etc.), epoxy resin, and photosensitive resin. These may be used alone or as a mixture of two or more thereof. The material for forming the polishing region may have a composition identical with, or different from, that of the light-transmitting region, but is preferably the same material as that of the light-transmitting region.

The polyurethane resin is a particularly preferable material as a material of the polishing region because it is excellent in abrasion resistance and serves as a polymer having desired physical properties by changing the composition of its starting materials.

The polyurethane resin comprises an organic isocyanate, a polyol (high-molecular-weight polyol and low-molecular-weight polyol), a chain extender and the like.

The organic isocyanate used is not particularly limited, and for example, the organic isocyanate described above can be mentioned.

The polyol used is not particularly limited, and for example, the polyol described above can be mentioned. The number-average molecular weight of the high-molecular-weight polyol is not particularly limited, but is preferably about 500 to 2000, from the viewpoint of the elastic characteristics and the like of the resulting polyurethane. When the number-average molecular weight is less than 500, the polyurethane obtained therefrom does not have sufficient elastic characteristics, thus becoming a brittle polymer. Accordingly, a polishing pad produced from this polyurethane is rigid to cause scratch of the polished surface of a subject to be polished. Further, because of easy abrasion, such polyurethane is not preferable from the viewpoint of the longevity of the pad. On the other hand, when the number-average molecular weight is higher than 2000, polyurethane obtained therefrom becomes soft, and thus a polishing pad produced from this polyurethane tends to be inferior in planarizing property.

The ratio of the high-molecular-weight polyol to the low-molecular-weight polyol is determined depending on characteristics required of the polishing region produced therefrom.

The chain extender includes polyamines such as 4,4'-methylene bis(o-chloroaniline), 2,6-dichloro-p-phenylene diamine, 4,4'-methylene bis(2,3-dichloroaniline) etc., or the above-described low-molecular-weight polyols. These may be used singly or as a mixture of two or more thereof.

The proportion of the organic isocyanate, the polyol and the chain extender in the polyurethane resin can be changed suitably depending on their respective molecular weights, desired physical properties of the polishing region produced therefrom, etc. To obtain the polishing region excellent in polishing characteristics, the ratio of the number of isocyanate groups of the organic isocyanate to the number of functional groups in total (hydroxyl group+amino group) in the polyol and the chain extender is preferably 0.95 to 1.15, more preferably 0.99 to 1.10.

The polyurethane resin can be produced by the same method as described above. A stabilizer such as an antioxidant etc., a surfactant, a lubricant, a pigment, a filler, an antistatic and other additives may be added if necessary to the polyurethane resin.

Examples of the method of finely foaming the polyurethane resin include, but are not limited to, a method of adding hollow beads, a mechanical foaming method and a chemical foaming method. These methods may be used in combination, and a mechanical foaming method using a silicone-based surfactant which is a polyalkyl siloxane/polyether copolymer is particularly preferable. As the silicone-based surfactant, SH-192 and L-5340 (manufactured by Toray Dow Corning Silicone Co., Ltd.) can be mentioned as a preferable compound.

An example of the method of producing fine cell polyurethane foam will be described below. The method of producing such polyurethane foam has the following steps.

1) Foaming Step of Preparing Air Bubble Dispersion of Isocyanate-Terminated Prepolymer A silicone-based surfactant is added to an isocyanate-terminated prepolymer (first component) followed by stirring in the presence of a nonreactive gas, and the nonreactive gas is dispersed as fine cells to form an air bubble dispersion. When the prepolymer is in a solid form at a normal temperature, the prepolymer is used after melted by pre-heating to an appropriate temperature.

2) Curing Agent (Chain Extender) Mixing Step

A chain extender (second component) is added to the air bubble dispersion, followed by mixing under stirring to give a foaming reaction solution.

3) Casting Step

The foaming reaction solution is poured into a mold.

4) Curing Step

The foaming reaction solution poured into the mold is reaction-cured by heating.

The nonreactive gas to be used for forming fine cells is preferably not combustible, and specific examples thereof include noble gases such as nitrogen, oxygen, a carbon dioxide gas, a rare gas such as helium and argon, and a mixed gas thereof, and air dried to remove water is most preferable in respect of cost.

As a stirrer for dispersing the nonreactive gas in the form of fine air bubbles into the silicone-based surfactant-containing isocyanate-terminated prepolymer, known stirrers can be used without particular limitation, and specific examples thereof include a homogenizer, a dissolver and a twin-screw planetary mixer. There is no particular limitation on the shape of a stirring blade of the stirrer, and a whipper-type stirring blade is preferably used because fine air bubbles are obtained.

In a preferable aspect, different stirrers are used in stirring for forming the air bubble dispersion in the stirring step and in stirring for mixing the added chain extender in the mixing step. In particular, stirring in the mixing step may not be stirring for forming air bubbles, and a stirrer not generating incorporation of large air bubbles is preferably used. Such a stirrer is preferably a planetary mixer. The same stirrer may be used in the stirring step and the mixing step, and stirring conditions such as rotation rate of the stirring blade are preferably regulated as necessary.

In the method of producing the polyurethane foam, heating and post-curing of the foam obtained after casting the foaming reaction solution into a mold and reacting it until the solution lost fluidity are effective in improving the physical properties of the foam, and are extremely preferable. The foaming reaction solution may be poured into a mold and immediately post-cured in a heating oven, and even under such conditions, heat is not immediately conducted to the reactive components, and thus the diameters of cells are not increased. The curing reaction is preferably conducted at normal pressure to stabilize the shape of cells.

In the production of the polyurethane resin, a known catalyst for promoting a polyurethane reaction, such as tertiary amine- or organotin-based catalysts, may be used. The type and amount of the catalyst added are selected in consideration of flow time in casting in a predetermined mold after the mixing step.

The production of the polyurethane foam may be in a batch system where each component is weighed out, charged into a vessel and mixed or in a continuous production system where each component and a nonreactive gas are continuously supplied to and stirred in a stirring apparatus and the resulting air bubble dispersion is sent to produce molded articles.

The polishing region is produced by cutting the polyurethane foam prepared as described above into pieces of predetermined size.

The polishing region is preferably provided with grooves for holding and renewing a slurry, on the surface of contacting with the subject to be polished. In the case where the polishing region is formed with a fine foam, many openings are on the polishing surface and work so as to hold the slurry. The grooves are preferably provided on the surface of the polishing side in order to effectively achieve more holdability and renewal of the slurry, and to prevent breakage of the subject to be polished due to adsorption of the subject to be polished. There is no particular limitation on the shape of the grooves as long as the structure is such that the slurry is retained and renewed, and examples thereof include XY latticed grooves, concentric circle-shaped grooves, through holes, non-through holes, polygonal prism, cylinder, spiral grooves, eccentric grooves, radial grooves, and a combination of these grooves. There is no particular limitation on the groove pitch, groove width and groove thickness, and they are appropriately selected to form the structure. These grooves are generally those having regularity, and the groove pitch, groove width and groove depth can also be changed at each certain region in order to make holdability and renewal of the slurry desirable.

There is no particular limitation on the thickness of the polishing region, and the thickness thereof is about 0.8 to 2.0 mm. Examples of the method of preparing the polishing region of this thickness include a method wherein a block of the fine-cell foam is cut in predetermined thickness by a slicer in a bandsaw system or a planing system, a method that involves casting resin into a mold having a cavity of predetermined thickness and curing the resin, and a method of using coating techniques and sheet molding techniques.

The cushion layer compensates for characteristics of the polishing region. The cushion layer is required for satisfying both planarity and uniformity which are in a tradeoff relationship in CMP. Planarity refers to flatness of a pattern region upon polishing a subject to be polished having fine unevenness generated upon pattern formation, and uniformity refers to the uniformity of the whole of a subject to be polished. Planarity is improved by the characteristics of the polishing region, while uniformity is improved by the characteristics of the cushion layer. The cushion layer in the polishing pad of the present invention is preferably softer than the polishing region.

There is no particular limitation on the material for forming the cushion layer, and examples of such a material include a nonwoven fabric such as a polyester nonwoven fabric, a nylon nonwoven fabric or an acrylic nonwoven fabric; a nonwoven fabric impregnated with a resin, such as a polyester nonwoven fabric impregnated with polyurethane; a polymer resin foam such as polyurethane foam or polyethylene foam; a rubber resin such as a butadiene rubber or an isoprene rubber; and a photosensitive resin.

The transparent support film 12 in FIG. 2 is a film formed by providing an adhesive layer on one side or both sides of a highly transparent resin film. Examples of the material of the resin film include polyester such as polyethylene terephthalate; polyethylene; polypropylene; polystyrene; polyimide; polyvinyl alcohol; polyvinyl chloride; fluorine-containing resin such as polyfluoroethylene; nylon; cellulose; general purpose engineering plastic such as polycarbonate; special engineering plastic such as polyetherimide, polyether ether ketone, and polyether sulfone; and the like. The composition of the adhesive layer includes, for example, a rubber-based adhesive agent, an acrylic adhesive agent, and the like. The adhesive layer of the transparent support film is provided so as to bond the resin film to the cushion layer or the polishing plate, and to bond the light-transmitting region to the resin film.

The thickness of the resin film is not particularly limited, but it is preferably about 20 to 200 μm in view of the transparency, the strength and the like.

It is necessary to use the transparent support film 12 having a size sufficient to completely close at least the opening part 10, and such a film having the same size as the cushion layer 11 is usually used.

The production method of the polishing pad 1 of FIG. 2 is not particularly limited, and various methods may be considered. Specific examples thereof will be described hereinafter.

Case 1

The polishing region 8 and the cushion layer 11 are bonded to each other, and then the opening part 10 that passes through the polishing region 8 and the cushion layer 11 is formed. After that, the transparent support film 12 is bonded onto one surface of the cushion layer 11. Thereafter, the light-transmitting region 9 is provided on the transparent support film 12 in the opening part 10.

Case 2

The polishing region 8 and the cushion layer 11 are bonded to each other, and then the opening part 10 that passes through the polishing region 8 and the cushion layer 11 is formed. After that, the transparent support film 12 is bonded onto one surface of the cushion layer 11. Thereafter, the soft layer 9b is provided onto the transparent support film 12 in the opening part 10. Subsequently, a surface layer forming composition is injected onto the soft layer 9b and cured to form the surface layer 9a.

Case 3

The polishing region 8 and the cushion layer 11 are bonded to each other, and then the opening part 10 that passes through the polishing region 8 and the cushion layer 11 is formed. After that, the transparent support film 12 is bonded onto one surface of the cushion layer 11. Thereafter, a soft layer forming composition is injected onto the transparent support film 12 in the opening part 10 and cured to form the soft layer 9b. Subsequently, a surface layer forming composition is injected onto the soft layer 9b and cured to form the surface layer 9a.

Also, there is no particular limitation on the method for producing the polishing pad 1 of FIG. 3. For example, the polishing pad 1 can be produced by respectively bonding the polishing region 8 having the through hole 14 and the cushion layer 11 having the through hole 15 to the adhesive layer of the double-sided adhesive sheet 13 so that the through holes 14 and 15 overlap each other, and then bonding the light-transmitting region 9 to the adhesive layer in the through hole 14. It may also be possible to form the soft layer 9b and the surface layer 9a by respectively injecting the soft layer forming composition and the surface layer forming composition, followed by curing. A double-sided tape may be provided on the surface bonded to the polishing plate (platen) of the cushion layer 11.

Examples of the means for bonding the polishing region 8 onto the cushion layer 11 include a method for pressing the polishing region 8 and the cushion layer 11 with a double-sided adhesive sheet 13 sandwiched therebetween. The double-sided adhesive sheet 13 has a general structure wherein an adhesive layer is provided on both surfaces of a base material such as a nonwoven fabric or a film, which is called a double sided tape. The composition of the adhesive layer includes, for example, a rubber-based adhesive agent and an acrylic adhesive agent. In consideration of the content of metallic ions, an acrylic adhesive is preferable because of a lower content of metallic ions. Because the polishing region 8 and the cushion layer 11 can be different in composition, the composition of each adhesive layer of the double-sided adhesive sheet 13 can be different to make the adhesive strength of each layer suitable.

There is no particular limitation on the means for forming the opening part 10 and the through holes 14 and 15, but examples thereof include a method for pressing or grinding with a cutting tool, a method using laser such as carbon dioxide laser, a method for pouring the raw material in a through hole-shaped mold, followed by curing and forming, and the like. It should be noted that the size and shape of the opening part 10 and the through holes 14 and 15 are not particularly limited.

A semiconductor device is produced through the step of polishing a surface of a semiconductor wafer using the polishing pad. The semiconductor wafer is generally obtained by laminating a wiring metal and an oxide film on a silicon wafer. There is no limitation on the polishing method and polishing apparatus of the semiconductor wafer. For example, as shown in FIG. 1, polishing is carried out using a polishing apparatus provided with a polishing plate 2 for supporting a polishing pad 1, a supporting stand (polishing head) 5 for supporting a semiconductor wafer 4, a backing material for uniformly pressurizing a wafer, and a mechanism of feeding an abrasive 3. The polishing pad 1 is fitted with the polishing plate 2, for example, by sticking with a double-sided tape. The polishing plate 2 and the supporting stand 5 are provided with rotating shafts 6 and 7, respectively, and are arranged such that the polishing pad 1 and the semiconductor wafer 4, both of which are supported by them, are opposed to each other. The supporting stand 5 is provided with a pressurizing mechanism for pressing the semiconductor wafer 4 against the polishing pad 1. In the case of polishing, while rotating the polishing plate 2 and the supporting stand 5, polishing is carried out by pressing the semiconductor wafer 4 against the polishing pad 1 with feeding a slurry. There is no limitation on the flow rate of a slurry, polishing load, rotation number of a polishing plate and rotation number of wafer, and polishing is carried out by appropriately adjusting.

Protrusions on the surface of the semiconductor wafer 4 are thereby removed and polished flatly. Thereafter, a semiconductor device is produced therefrom through dicing, bonding, packaging and the like. The semiconductor device is used in an arithmetic processor, a memory and the like.

EXAMPLES

Hereinafter, the Examples illustrating the constitution and effect of the present inventions are described.
[Measurement and Evaluation Method]
(Measurement of Scratches)
Using the prepared polishing pad with use of a polishing apparatus ARW-8C1A (manufactured by MAT Corporation), evaluation of scratches was carried out. Ceria slurry (manufactured by Hitachi Chemical Co., Ltd.) as a slurry was added at a flow rate of 150 ml/min during the polishing under the following polishing condition. The condition includes a polishing load of 350 g/cm$^2$, a polishing plate rotation speed of 65 rpm, and a wafer rotation speed of 60 rpm. Four 8-inch dummy wafers were polished under the above conditions and then an 8-inch wafer on which a thermally oxidized film having a thickness of 10000 angstrom was deposited was polished for 1 minute. Then, using a surface defect detector (Surfscan SP1, manufactured by KLA-Tencor Corporation), the number of scratches of 0.19 μm or more on the polished wafer was measured.

Production Example 1

Preparation of Light-Transmitting Region A

One hundred parts by weight of isocyanate-terminated prepolymer (CORONATE 4080, NCO content: 3.0% by weight, manufactured by Nippon Polyurethane Industry Co., Ltd.) adjusted to 70° C. were weighed in a vacuum tank, and the gas remaining in the prepolymer was defoamed by reducing the pressure to about 10 Torr. Then, 10 parts by weight of tri(2-chloropropyl)phosphate were added thereto and the mixture was uniformly mixed. To the resulting mixture were added 8.6 parts by weight of 4,4'-methylenebis (o-chloroaniline) (IHARACUAMINE-MT, manufactured by IHARA CHEMICAL INDUSTRY CO., LTD.) which had been previously melted at 120° C. The resulting mixture was stirred for about 1 minute using a hybrid mixer (manufactured by KEYENCE CORPORATION) to give a mixture. Then, the mixture was poured into a mold and post-cured in an oven at 100° C. for 15 hours, thereby to obtain a light-transmitting region surface layer (60 mm in height, 20 mm in width, 1.2 mm in thickness, A hardness of 75 degrees) made of a polyurethane resin (plasticizer content: 2.3% by weight).

One hundred parts by weight of isocyanate-terminated prepolymer (CORONATE 4080, NCO content: 3.0% by weight, manufactured by Nippon Polyurethane Industry Co., Ltd.) adjusted to 70° C. were weighed in a vacuum tank, and the gas remaining in the prepolymer was defoamed by reducing the pressure to about 10 Torr. Then, 70 parts by weight of tri(2-chloropropyl)phosphate were added thereto and the mixture was uniformly mixed. To the resulting mixture were added 8.6 parts by weight of 4,4'-methylenebis (o-chloroaniline) (IHARACUAMINE-MT, manufactured by IHARA CHEMICAL INDUSTRY CO., LTD.) which had been previously melted at 120° C. The resulting mixture was stirred for about 1 minute using a hybrid mixer (manufactured by KEYENCE CORPORATION) to give a mixture. Subsequently, the mixture was poured under the light-transmitting region surface layer in the mold and post-cured in an oven at 100° C. for 8 hours to form a first soft layer (60 mm in height, 20 mm in width, 0.8 mm in thickness, A hardness of 32 degrees) made of a polyurethane resin (plasticizer content: 39.2% by weight), so that a light-transmitting region A was prepared.

Production Examples 2 to 9

Preparation of Light-Transmitting Regions B to I

Light-transmitting regions B to I were prepared in the same manner as in Production Example 1, except that the added amount of tri(2-chloropropyl)phosphate was changed as described in Table 1. However, in the Production Example 5, a light-transmitting region E was prepared by further laminating a second soft layer (thickness 0.4 mm) on one surface of the first soft layer (thickness 0.4 mm).

Example 1

Preparation of Polishing Region

In a reaction vessel, 100 parts by weight of a polyether-based prepolymer (Adiprene L-325, manufactured by Uniroyal Chemical Corporation, with an NCO concentration of 2.22 meq/g) was mixed with 3 parts by weight of a silicone-based nonionic surfactant (SH192, manufactured by Dow Corning Toray Silicone Co., Ltd.), and then the temperature of the mixture was controlled at 80° C. The mixture was vigorously stirred at a rotation number of 900 rpm for about 4 minutes with a stirring blade so that air bubbles were incorporated into the reaction system. To the reaction system, 26 parts by weight of 4,4'-methylenebis(o-chloroaniline) (IHARACUAMINE MT, manufactured by IHARA CHEMICAL INDUSTRY CO., LTD.) melted at 120° C. in advance was added. Thereafter, the reaction system was continuously stirred for about 1 minute and the reaction solution was poured into a pan type open mold. When the reaction solution lost fluidity, it was put into an oven and postcured at 110° C. for 6 hours to obtain a polyurethane foam block. The polyurethane foam block was sliced with a bandsaw type slicer (manufactured by Fecken-Kirfel) to obtain a polyurethane foam sheet (having an average cell diameter of 50 μm, a specific gravity of 0.86 and a hardness D of 55 degrees). Then, the sheet was surface-buffed to a predetermined thickness with a buffing machine (manufactured by AMITEC Corporation) to obtain a sheet with an adjusted thickness precision (having a thickness of 2 mm). The buff-treated sheet was punched into a disc with a diameter of 61 cm, and grooving was performed on the surface of the disc using a grooving machine (manufactured by Toho Koki Co., Ltd.) to form concentric circular grooves each with a width of 0.40 mm and a depth of 0.76 mm at a groove pitch of 3.1 mm. A double sided tape (a double tack tape, a thickness of 0.10 mm, manufactured by Sekisui Chemical Co., Ltd.) was bonded onto a surface, which was opposite to the groove processed surface of the sheet with a laminator, thereby to prepare a polishing region attached with a double sided tape.

(Preparation of Polishing Pad)

A cushion layer made of a corona-treated polyethylene foam (TORAYPEF with a thickness of 0.8 mm, manufactured by TORAY INDUSTRIES, INC.), a surface of which was buffed, was bonded onto an adhesive surface of the polishing region attached with a double sided tape by using a laminator, thereby to prepare a polishing sheet. Then, an opening part with a size of 60 mm×20 mm was formed in the polishing sheet. A transparent support film (polyethylene terephthalate with a thickness of 50 μm as a base material) having an adhesive layer on both sides was bonded onto the cushion layer of the polishing sheet, thereby to obtain a laminate. After that, a polishing pad having the structure described in FIG. 2 was prepared by bonding the light-transmitting region A to the transparent support film in the opening part of the laminate.

Example 2

Preparation of Polishing Region

An opening part having a size of 60 mm×20 mm was formed in a polyurethane foam sheet that was prepared and grooved in the same manner as in Example 1. After that, a double sided tape (a double tack tape, a thickness of 0.10 mm, manufactured by Sekisui Chemical Co., Ltd.) was bonded onto a surface, which was opposite to the groove processed surface of the sheet with a laminator. Then, a polishing region attached with a double sided tape was prepared by bonding the light-transmitting region B to the double sided tape in the opening part.

(Preparation of Polishing Pad)

A cushion layer made of a corona-treated polyethylene foam (TORAYPEF with a thickness of 0.8 mm, manufactured by TORAY INDUSTRIES, INC.), a surface of which was buffed, was bonded onto an adhesive surface of the polishing region attached with a double sided tape by using a laminator, thereby to prepare a polishing sheet. Then, a transparent support film (polyethylene terephthalate with a thickness of 50 μm as a base layer) having an adhesive layer on both sides was bonded onto the cushion layer of the polishing sheet, thereby to obtain a laminate. After that, an opening part in the size of 60 mm×20 mm was formed only in the cushion layer and the transparent support film of the laminate, thereby to prepare a polishing pad having the structure as described in FIG. 3 (the transparent support film is not shown).

Examples 3 to 6 and Comparative Examples 1 to 3

A polishing pad was prepared in the same manner as in Example 1, except that anyone of the light-transmitting regions C to I was used instead of the light-transmitting region A.

TABLE 1

| | | Example 1 Light-transmitting region A | Example 2 Light-transmitting region B | Example 3 Light-transmitting region C | Example 4 Light-transmitting region D | Example 5 Light-transmitting region E | Example 6 Light-transmitting region F | Comparative Example 1 Light-transmitting region G | Comparative Example 2 Light-transmitting region H | Comparative Example 3 Light-transmitting region I |
|---|---|---|---|---|---|---|---|---|---|---|
| Content of tri (2-chloropropyl) phosphate (% by weight) | Light-transmitting region surface layer | 8.4 | 23.3 | 12.1 | 8.4 | 8.4 | 37.4 | 40.8 | 30.7 | 39.2 |
| | First soft layer | 40.8 | 30.7 | 30.7 | 18.7 | 40.8 | 40.8 | 12.1 | 23.3 | 4.4 |
| | Second soft layer | — | — | — | — | 47.9 | — | — | — | — |

TABLE 1-continued

|  |  | Example 1 Light-transmitting region A | Example 2 Light-transmitting region B | Example 3 Light-transmitting region C | Example 4 Light-transmitting region D | Example 5 Light-transmitting region E | Example 6 Light-transmitting region F | Comparative Example 1 Light-transmitting region G | Comparative Example 2 Light-transmitting region H | Comparative Example 3 Light-transmitting region I |
|---|---|---|---|---|---|---|---|---|---|---|
| Asker A hardness (degree) | Light-transmitting region surface layer | 75 | 55 | 70 | 75 | 75 | 35 | 30 | 45 | 32 |
|  | First soft layer | 30 | 45 | 45 | 60 | 30 | 30 | 70 | 55 | 80 |
|  | Second soft layer | — | — | — | — | 20 | — | — | — | — |
|  | Scratch (number/wafer) | 5 | 6 | 8 | 9 | 7 | 7 | 25 | 16 | 46 |

INDUSTRIAL APPLICABILITY

A polishing pad of the invention is capable of performing planarization materials requiring a high surface planarity such as optical materials including a lens and a reflective mirror, a silicon wafer, an aluminum substrate and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon.

DESCRIPTION OF REFERENCE SIGNS

1: Polishing pad
2: Polishing plate (platen)
3: Abrasive (Slurry)
4: Subject to be polished (Semiconductor wafer)
5: Supporting stand (Polishing head)
6, 7: Rotating shafts
8: Polishing region
9: Light-transmitting region
9a: Surface layer
9b: Soft layer
10: Opening part
11: Cushion layer
12: Transparent support film
13: Double-sided adhesive sheet
14, 15: Through hole

The invention claimed is:

1. A polishing pad provided with a polishing layer having a polishing region and a light-transmitting region, wherein the light-transmitting region includes a surface layer positioned on the pad surface side and at least one soft layer laminated under the surface layer, and the soft layer has a hardness lower than that of the surface layer, wherein the Asker A hardness of the surface layer is 35 to 80 degrees and the Asker A hardness of the soft layer is 30 to 60 degrees.

2. A polishing pad provided with a polishing layer having a polishing region and a light-transmitting region, wherein the light-transmitting region includes a surface layer positioned on the pad surface side and at least one soft layer laminated under the surface layer, and the soft layer has a hardness lower than that of the surface layer, wherein the difference in the Asker A hardness between the surface layer and the soft layer is 5 degrees or more.

3. The polishing pad according to claim 1, wherein the difference in the Asker A hardness between the surface layer and the soft layer is 5 degrees or more.

4. The polishing pad according to claim 1, wherein the soft layer is formed of one layer.

5. A method for producing a semiconductor device, comprising the step of polishing the surface of a semiconductor wafer by using the polishing pad according to claim 1.

6. The polishing pad according to claim 2, wherein the soft layer is formed of one layer.

7. A method for producing a semiconductor device, comprising the step of polishing the surface of a semiconductor wafer by using the polishing pad according to claim 2.

8. The polishing pad according claim 3, wherein the soft layer is formed of one layer.

9. A method for producing a semiconductor device, comprising the step of polishing the surface of a semiconductor wafer by using the polishing pad according to claim 3.

10. A method for producing a semiconductor device, comprising the step of polishing the surface of a semiconductor wafer by using the polishing pad according to claim 4.

11. A method for producing a semiconductor device, comprising the step of polishing the surface of a semiconductor wafer by using the polishing pad according to claim 6.

12. A method for producing a semiconductor device, comprising the step of polishing the surface of a semiconductor wafer by using the polishing pad according to claim 8.

* * * * *